(12) United States Patent
No

(10) Patent No.: US 7,953,898 B2
(45) Date of Patent: May 31, 2011

(54) APPARATUS AND METHOD FOR USING EXPANSION KEY IN PORTABLE TERMINAL

(75) Inventor: Jin-Hong No, Seoul (KR)

(73) Assignee: Samsung Electronics Co., Ltd (KR)

( * ) Notice: Subject to any disclaimer, the term of this patent is extended or adjusted under 35 U.S.C. 154(b) by 430 days.

(21) Appl. No.: 11/835,255

(22) Filed: Aug. 7, 2007

(65) Prior Publication Data

US 2008/0034124 A1 Feb. 7, 2008

(30) Foreign Application Priority Data

Aug. 7, 2006 (KR) .......................... 10-2006-0074097

(51) Int. Cl.
*G06F 3/00* (2006.01)
*G06F 12/00* (2006.01)

(52) U.S. Cl. ............................................... 710/2; 711/1

(58) Field of Classification Search ..................... 710/2
See application file for complete search history.

(56) References Cited

U.S. PATENT DOCUMENTS

| 5,402,121 | A | * | 3/1995 | Noorbehesht | 341/26 |
| 5,554,985 | A | * | 9/1996 | Chang | 341/26 |
| 5,790,054 | A | * | 8/1998 | Hsu et al. | 341/22 |
| 2002/0177475 | A1 | * | 11/2002 | Park | 455/574 |

OTHER PUBLICATIONS

Dave Dribin, Keyboard Matrix Help, Jun. 2000, p. 1-13.*

* cited by examiner

*Primary Examiner* — Henry W Tsai
*Assistant Examiner* — Juanito C Borromeo
(74) *Attorney, Agent, or Firm* — The Farrell Law Firm, P.C.

(57) ABSTRACT

An input apparatus for using an expansion key in a portable terminal includes an expansion key matrix unit which forms a key matrix through which a plurality of expansion keys are input; an input/output (I/O) expansion chip which, in response to a key input through the expansion key matrix unit, transmits a value of an input port of the input/output (I/O) expansion chip to store in an internal parameter, changes the input port to an output port, and vice versa, reads a value of the changed input port, and transmits the read value to the MSM chip to be stored in the internal parameter; and the MSM chip which recognizes a corresponding expansion key based on the stored parameters.

11 Claims, 5 Drawing Sheets

APPARATUS AND METHOD FOR USING EXPANSION KEY IN PORTABLE TERMINAL

PRIORITY

This application claims priority under 35 U.S.C. §119 to an application filed in the Korean Intellectual Property Office on Aug. 7, 2006 and assigned Serial No. 2006-74097, the contents of which are hereby incorporated by reference.

BACKGROUND OF THE INVENTION

1. Field of the Invention

The present invention relates to an apparatus and a method for using an expansion key in a portable terminal, and more particularly, to an apparatus and a method for using an expansion key by use of a general purpose input/output (GPIO) extension in a portable terminal.

2. Description of the Related Art

As a portable terminal is included with the main functions of the computer such as word processing, e-mails, chats, or memos, more function keys are required to be incorporated into the portable terminal to use these functions. Devices such as Personal Digital Assistants (PDA) or QWERTY phones, which operate to provide mainly email services or messenger services, particularly need more keys. The keys generally correspond to N columns and M rows of an N*M matrix. For example, up to 25 keys can be provided for a keypad of 5*5 key matrix.

FIG. 1 is a block diagram of a 5*6 key matrix keypad input apparatus of a conventional portable terminal.

Referring to FIG. 1, a keypad of a conventional portable terminal generally includes a Mobile Station Modem (MSM) chip 100 which processes interrupts according to the key input through a key matrix unit 102 of 5 columns and 6 rows, and the key matrix unit 102 which forms a key matrix connected with KEYSENSE pins of the MSM chip 100 so that various numerals or text information, including English or Korean symbols, or the like, can be input therethrough.

For example, the columns of the key matrix unit 102 are in a pull-up state, that is, in a high state, and the rows of the key matrix unit 102 are in a pull-down state, that is, in a low state. If a user presses numeral key '1', KEY SEND8 of the MSM chip 100 is connected with KEY SEND0 such that the voltage level of KEY SEND8 is grounded, causing an interrupt. Accordingly, the MSM chip 100 recognizes the interrupt, conducts key scan and recognizes a corresponding key.

FIG. 2 is a block diagram of an apparatus having an expansion key, which uses a spare External Interrupt port of a MSM chip according to a prior art technology.

Referring to FIG. 2, an expansion key input apparatus of a portable terminal includes a Mobile Station Modem (MSM) chip 200 which processes the interrupt according to the key input through a key matrix unit 204, and which processes data associated with the input of an expansion key from a spare External Interrupt port, and a key expansion unit 202 which generates an interrupt of the expansion key. The key expansion unit 202 is connected between the spare External Interrupt port of the MSM chip 200 and the key matrix unit 204 which forms a key matrix connected with KEYSENSE pins of the MSM chip 200 such that various numerals and/or text information, including English or Korean symbols, or the like, and other various functional information can be input there through.

Conventionally, a key map is configured using 5*5, or 6*6 fixed key matrix which is generally supported by the MSM chip. However, this limits the use of keys due to limited number of the pins supporting the key matrix in one MSM chip, and is disadvantageous for the devices like the Personal Digital Assistants (PDA) or QWERTY phones, which require frequent key inputs. Therefore, it is not only inconvenient, but also time-consuming for a user, because he has to change between different language versions such as English mode, Korean mode, or Number mode while he writes an email or uses a messenger service, due to limited size of the key matrix of the keypad.

A few more keys can be added using a spare External Interrupt port of the MSM chip 200. However, because only a small number of External Interrupt ports is usually provided, a sufficient key expansion cannot be obtained. A custom integrated circuit may also be used to expand the key matrix and provide an increased number of key inputs, but unit cost increases.

Accordingly, an apparatus and a method for a key input of a portable terminal, which use an economic general purpose input/output (GPIO) expansion chip, rather than a custom integrated circuit, to expand input/output (I/O) ports of a MSM chip, and which realize an expansion key matrix by use of the I/O expansion port, are necessary.

SUMMARY OF THE INVENTION

An aspect of the present invention is to substantially solve at least the above problems and/or disadvantages and to provide at least the advantages below. Accordingly, an aspect of the present invention is to provide an apparatus and a method for using an expansion key in a portable terminal.

Another aspect of the present invention is to provide an apparatus and a method for using a plurality of expansion keys, by use of an input/output expansion chip in a portable terminal.

Yet another aspect of the present invention is to provide an apparatus and a method for realizing an expansion key matrix in a portable terminal, which extends the usage of a portable terminal and provides user with convenient data input.

The above aspects are achieved by providing an input apparatus and method for using an expansion key in a portable terminal.

According to one aspect of the present invention, an input apparatus for using an expansion key in a portable terminal, comprises an expansion key matrix unit which forms a key matrix through which a plurality of expansion keys are input; an input/output (I/O) expansion chip which, in response to a key input through the expansion key matrix unit, reads a value of an input port of the input/output (I/O) expansion chip, transmits the read value to a Mobile Station Modem (MSM) chip to be stored in an internal register, changes the input port to an output port, changes an output port to an input port, reads a value of the changed input port, and transmits the read value to the MSM chip to be stored in the internal register; and the MSM chip which recognizes a corresponding expansion key based on the value transmitted from the I/O expansion chip.

According to another aspect of the present invention, an input method for using an expansion key in a portable terminal, comprises reading a value of an initial input port of an input/output (I/O) expansion chip in response to a key input through an expansion key matrix unit, transmitting the read value to a Mobile Station Modem (MSM) chip to be stored in an internal register, changing the initial input port to an output port, and changing an initial output port to an input port, reading a value of the changed input port of the I/O expansion chip, and transmitting the read value to the MSM chip to be stored in an internal register.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

An apparatus and a method for using an expansion key, which uses a general purpose input/output (GPIO) extension according to an exemplary embodiment of the present invention, will be explained below.

Figure 1:
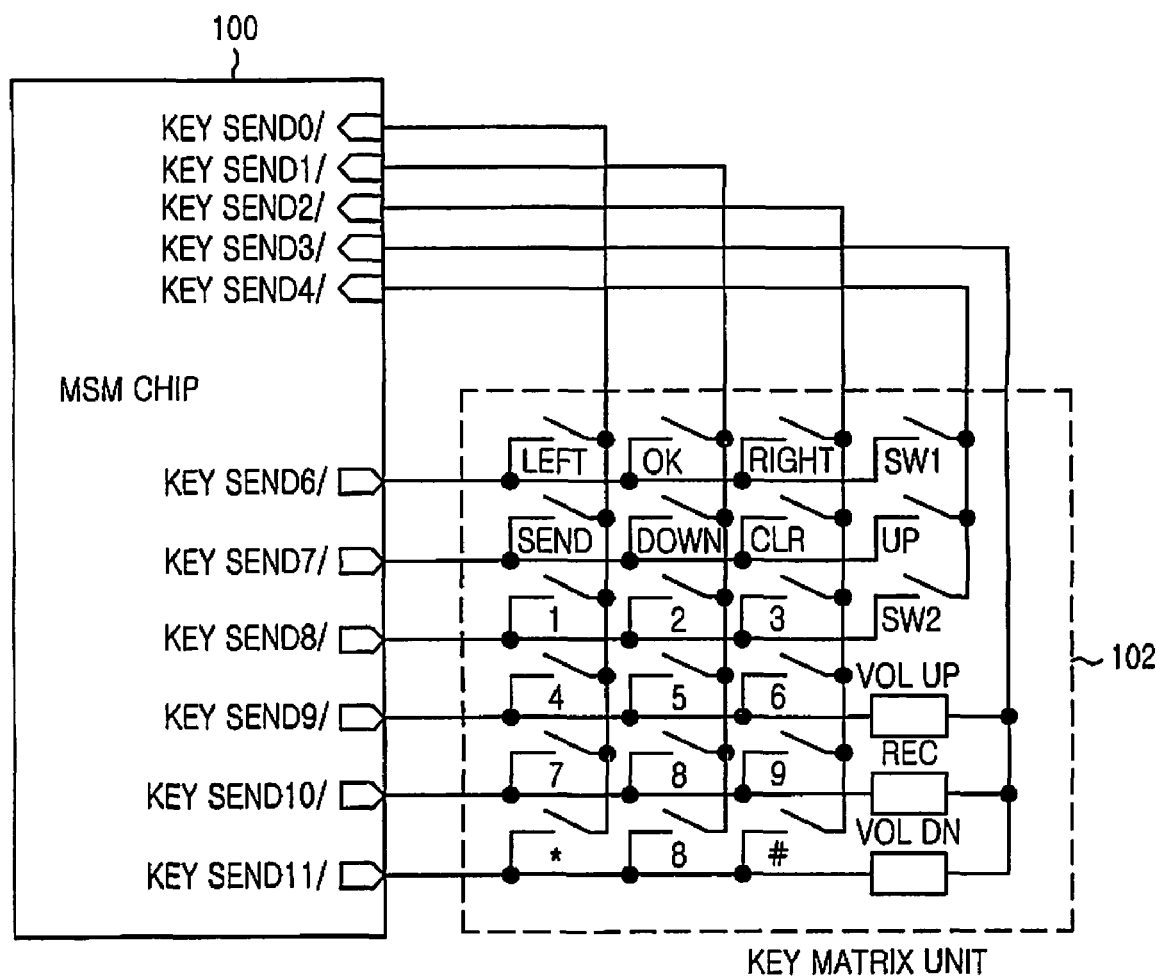
FIG. 1 is a block diagram of a key pad input apparatus of a 5*6 key matrix in a conventional portable terminal.
Figure 2:
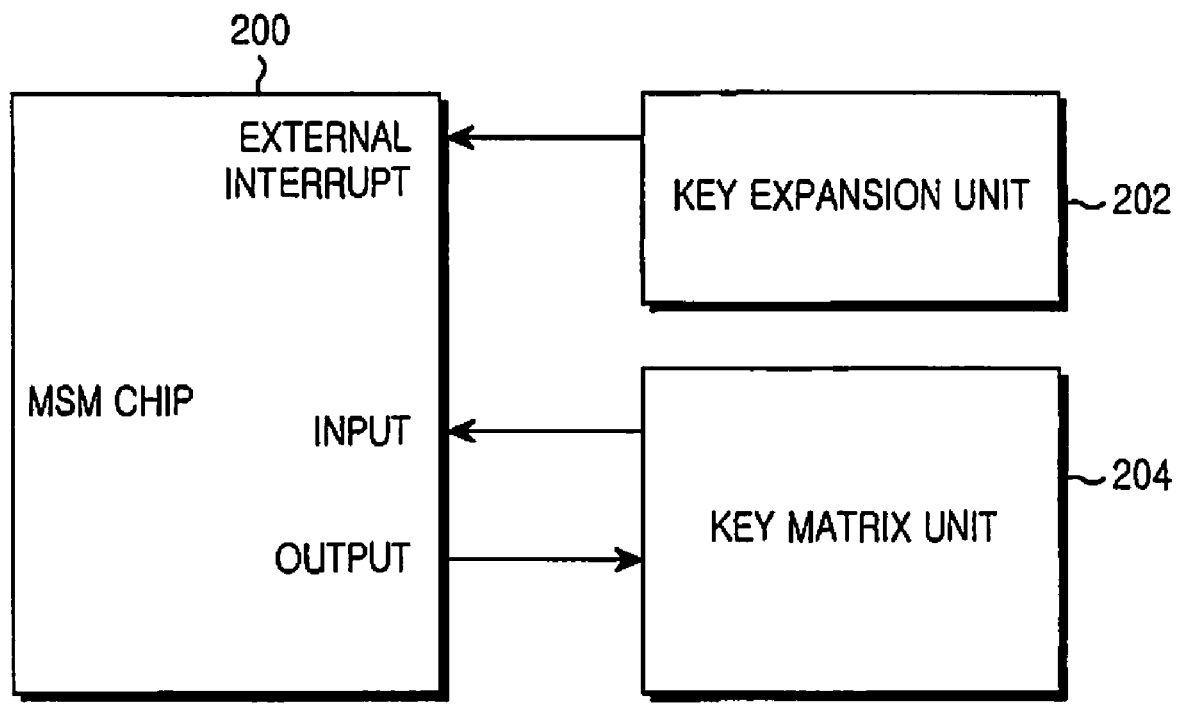
FIG. 2 is a block diagram of a conventional apparatus having an expansion key, using a spare External Interrupt port of a Mobile Station Modem (MSM) chip.
Figure 3:
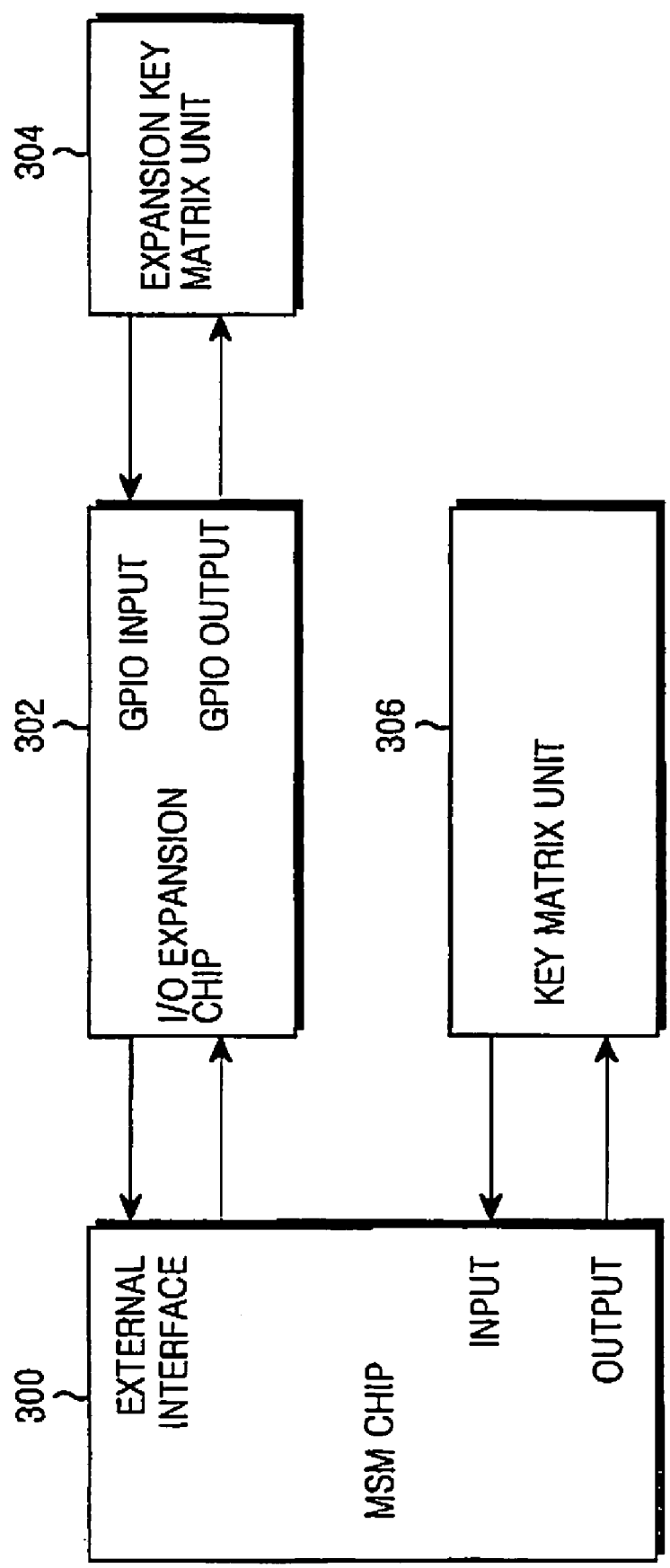
FIG. 3 is a block diagram of an apparatus for providing a plurality of expansion keys, by use of an input/output (I/O) expansion chip according to the present invention.

FIG. 3 is a block diagram of an apparatus for providing a plurality of expansion keys, by use of an input/output (I/O) expansion chip according to the present invention.

Referring to FIG. 3, an expansion key input apparatus of a portable terminal includes a Mobile Station Modem (MSM) chip 300 which recognizes information of an input key by processing an interrupt generated according to a key input through a key matrix unit 306, and which processes the interrupt of an expansion key based on I2C (Inter-IC) communication with an input/output (I/O) expansion chip 302 via an external interface, a key matrix unit 306 connected with I/O ports such as KEYSENSE of the MSM chip 300 to form a key matrix such that numeral and text information, including English, Korean, symbols or the like, and various functional information is input there through, an expansion key matrix unit 304 connected with a general purpose input/output (GPIO) port of the I/O expansion chip 302 to form a N*M key matrix to provide a plurality of expansion key inputs, and the I/O expansion chip 302 which provides a plurality of GPIO to supplement insufficient I/O ports of the MSM chip 300, and which generates a corresponding interrupt in response to an expansion key input through the expansion key matrix unit 304, and provides the MSM chip 300 with the generated interrupt using I2C communication.

Figure 4:
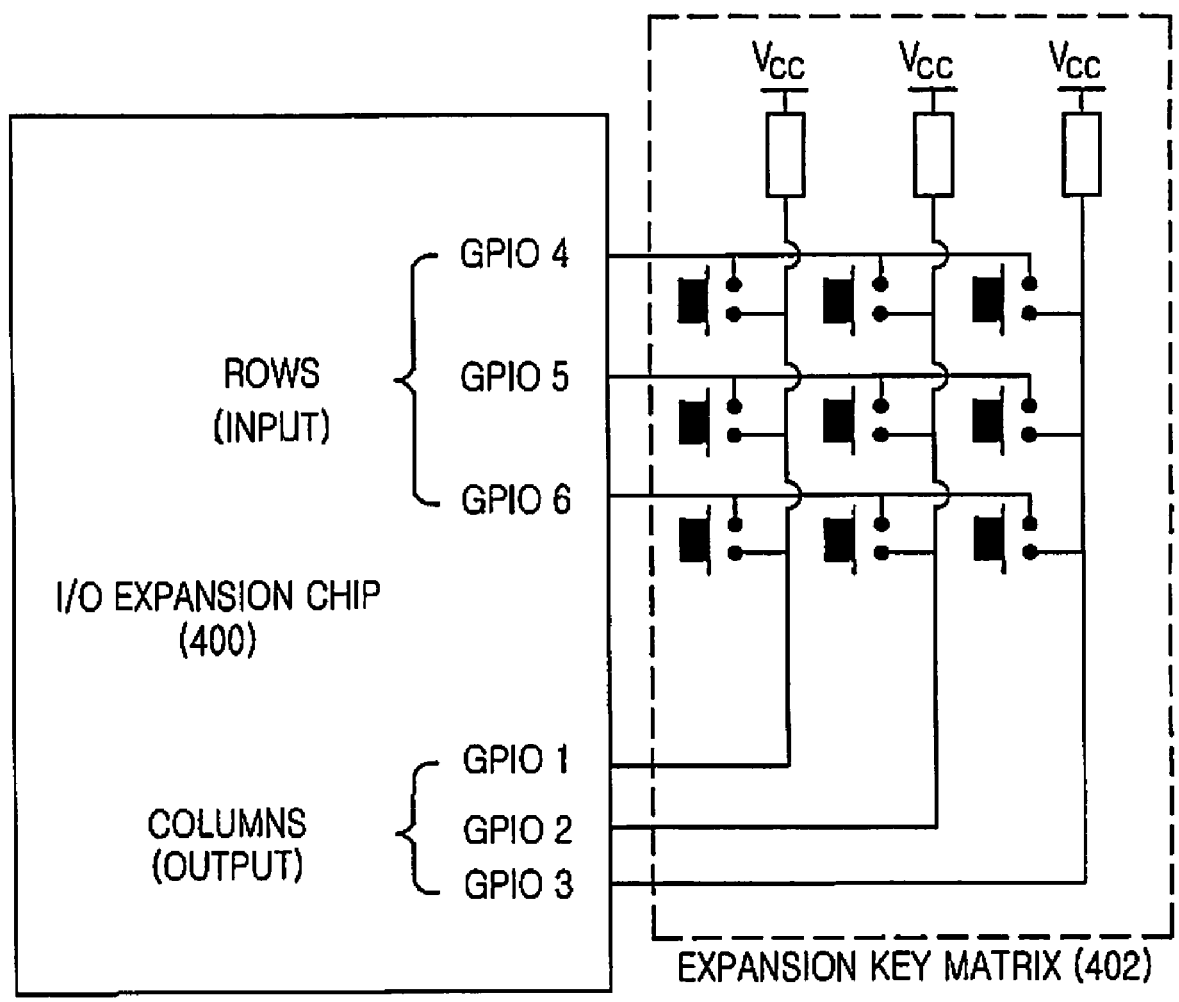
FIG. 4 is a block diagram of an apparatus for providing a plurality of expansion keys, by use of an input/output (I/O) expansion chip according to the present invention.

FIG. 4 is a block diagram of an apparatus for providing a plurality of expansion keys, by use of an I/O expansion chip according to the present invention.

Referring to FIG. 4, an exemplary implementation configures 3*3 key matrix for expansion key input, by using six GPIO ports of the I/O expansion chip 400. GPIO 1, 2 and 3, corresponding to the columns of the key matrix, are used as output ports and set to high state, while GPIO 4, 5 and 6, corresponding to the rows of the key matrix, are used as input ports and set to low state.

For example, if a key corresponding to GPIO 2 (column) and GPIO 6 (row) is pressed in the I/O expansion chip 400, GPIO 2 remains in high state, and GPIO 6 changes from low state to high state. That is, by the pressing of the keys corresponding to GPIO 2 and GPIO 4-6, the values of GPIO 4, 5 and 6 respectively are changed to LOW LOW HIGH (001), and due to the change of the input ports, an expansion key interrupt is generated, and the value of the input port is transmitted to the MSM chip 300 through I2C communication and stored in an internal register of the MSM chip 300. Because GPIO 2 does not have any change of signal, it is not recognizable which port is pressed. The output and input direction of GPIO may be changed to read values of other output ports. That is, the input ports GPIO 4, 5 and 6 are changed to output ports, and the output ports GPIO 1, 2 and 3 are changed to input ports. The change of input and output direction may be made by changing a register value of the I/O expansion chip 400 which determines the input and output direction of the ports.

The changed values of the input ports GPIO 1, 2 and 3 are read, transmitted to the MSM chip 300 by I2C communication, and stored in the internal register of the MSM chip 300. For the next key input, the input and output direction of the GPIO is initialized, that is, GPIO 4, 5 and 6 are reset to input ports, and GPIO 1, 2 and 3 are reset to output ports.

Figure 5:
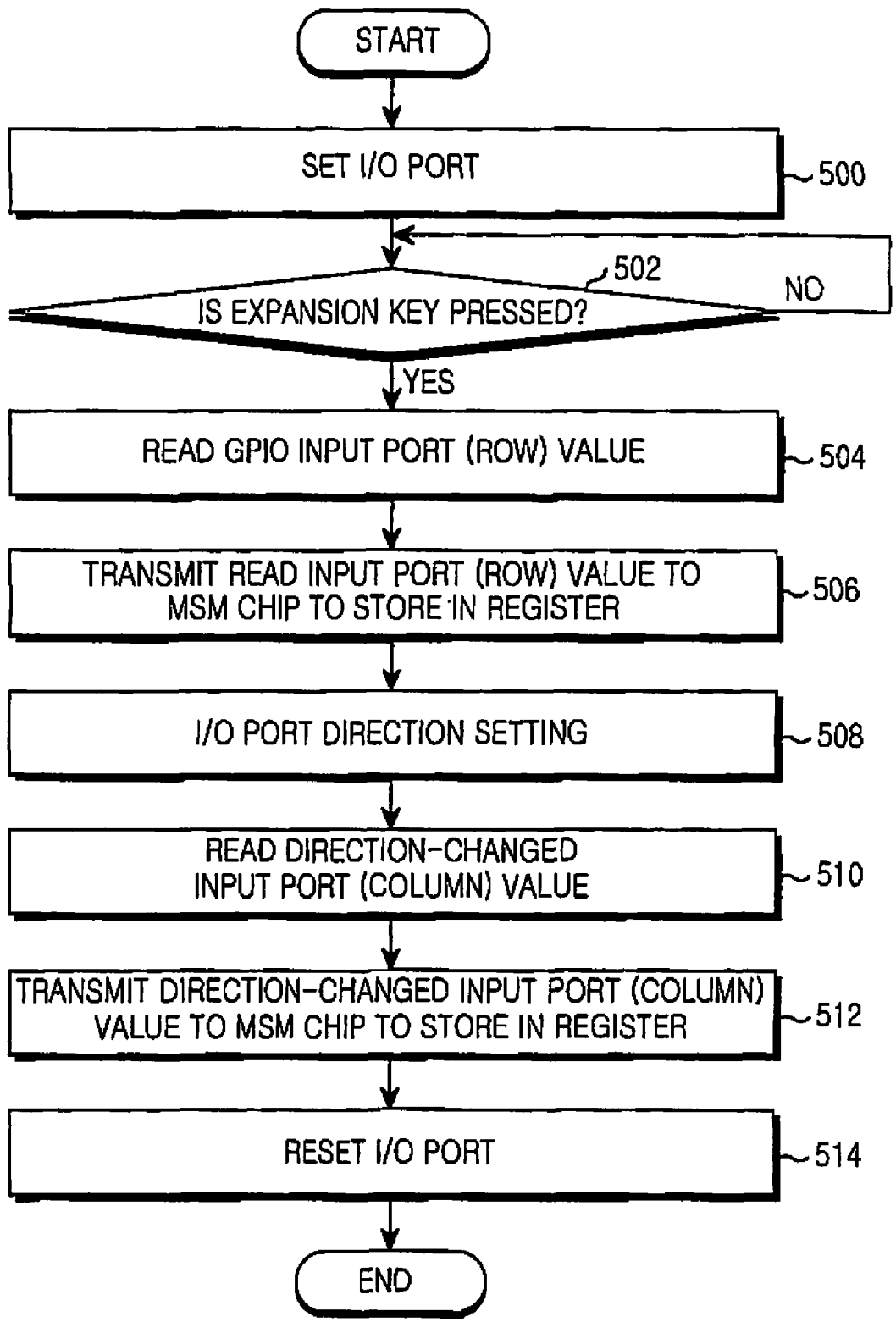
FIG. 5 is a flowchart for illustrating the process of recognizing a plurality of expansion keys, by use of an input/output (I/O) expansion chip according to the present invention.

FIG. 5 is a flowchart for illustrating the process of recognizing a plurality of expansion keys, by use of an input/output (I/O) expansion chip according to the present invention.

Referring to FIG. 5, a 3*3 key matrix is configured by use of six GPIO ports of I/O extension. GPIO 1, 2 and 3, corresponding to the columns of the key matrix, are set to output ports and high state, and GPIO 4, 5 and 6, corresponding to the rows of the key matrix, are set to input ports and low state in step 500.

If an expansion key is pressed and an expansion key interrupt is generated in step 502, the process moves to step 504 and reads out values of the input ports GPIO 4, 5 and 6. For example, if a key corresponding to GPIO 2 (column) and GPIO 6 (row) is pressed, GPIO 2 remains in the high state, while GPIO 6 is changed from low state to high state. Because it is not possible to confirm which port is pressed based on the values of column ports, that is, GPIO 1, 2 and 3, the values of row ports, that is, the values of GPIO 1, 2 and 3 are read in step 504. The key corresponding to GPIO 6 is pressed such that the values of GPIO 4, 5 and 6 are read as LOW LOW HIGH (001).

The read values (001) of the input ports are transmitted to the MSM chip 300 by I2C communication, and stored in an internal register in step 506.

Direction setting is performed in step 508, such that the input ports GPIO 4, 5 and 6 are changed to output ports, and the output ports GPIO 1, 2 and 3 are changed to input ports. The input ports are set to low state, and the output ports are set to high state.

The direction setting of the input and output ports is performed, by changing a register value of the GPIO, which determines input and output direction.

The values of the changed input ports GPIO 1, 2 and 3 are read in step 510.

In the state that the key corresponding to GPIO 2 (column) and GPIO 6 (row) is pressed, GPIO 2 is changed from low state to high state, and GPIO 6 remains in high state. Accordingly, the values of the changed GPIO 1, 2 and 3, corresponding to the columns, are read. The values of the changed GPIO 1, 2 and 3, in the state that the key corresponding to GPIO 2 is pressed, are read as LOW HIGH LOW (010).

The values (010) of the changed input ports are transmitted to the MSM chip 300 by I2C communication and stored in the register in step 510.

The input and output direction of the GPIO ports are initialized for the next key input in step 514. Accordingly, GPIO 4, 5 and 6 ports are reset to input ports, and GPIO 1, 2 and 3 are reset to output ports. The algorithm according to the present invention is completed.

The algorithm according to the present invention is generally processed in the duration that the user presses the keys. It takes 1 ms at 300 kbps I2C communication between the MSM chip 300 and the I/O expansion chip 400, and thus the algorithm may be processed within 2~3 ms. Considering that a general user presses the key for approximately 50~100 ms, minimum 10 ms will be sufficient to switch input and output ports and recognize keys. Accordingly, the embodiments of the present invention are realizable, because the current Embedded System uses I2C bus of more than 100 kbps.

Because relatively economic GIPO expansion chip is used to extend the keys, rather than an expensive custom integrated circuit, supplement I/O ports can be provided to the MSM chip 300 at a low cost.

The input method according to embodiments of the present invention can also be embodied as computer-readable codes on a computer-readable medium. A computer-readable medium is any data storage device that can store data, which can thereafter be read by a computer system. Examples of computer-readable mediums include, but are not limited to, computer-readable recording mediums such as Read-Only Memory (ROM), Random-Access Memory (RAM), CD-ROMs, magnetic tapes, floppy disks, and optical data storage devices. Computer-readable mediums also include carrier waves (such as data transmission through the Internet via wired or wireless transmission paths). The computer-readable medium can also be distributed over network-coupled computer systems so that the computer-readable code is stored and executed in a distributed fashion. Also, function programs, codes, and code segments for accomplishing the present invention can be easily construed as within the scope of the invention by programmers skilled in the art to which the present invention pertains.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An input apparatus for using an expansion key in a portable terminal, comprising:
    an expansion key matrix unit for forming an M×N key matrix through which a plurality of expansion keys are input, wherein M is a number of input ports and N is a number of output ports;
    an Input/Output (I/O) expansion chip for, in response to a key input through the expansion key matrix unit, reading first values of M input ports of the I/O expansion chip, transmitting the first values to a Mobile Station Modem (MSM) chip to be stored in an internal register, changing the M input ports to M output ports and changing N output ports to N input ports, reading second values of the changed N input ports, and transmitting the second values to the MSM chip to be stored in the internal register; and
    the MSM chip for recognizing a corresponding expansion key based on values transmitted from the I/O expansion chip,
    wherein the I/O expansion chip and the MSM chip communicate with each other by Inter Integrated Circuit (I2C) communication.

2. The apparatus of claim 1, further comprising a key matrix unit connected with an input/output port of the MSM chip, the key matrix unit for forming a key matrix such that numerical and text information, including English, Korean and symbols, and other functional information are input therethrough.

3. The apparatus of claim 1, wherein the expansion key matrix unit realizes a key matrix, using an I/O port of the I/O expansion chip.

4. The apparatus of claim 1, wherein the change of the M input ports to the M output ports and the N output ports to the N input ports is realized by changing an internal register value of the I/O expansion chip to determine input and output directions, according to the instruction from the MSM chip.

5. The apparatus of claim 1, wherein values being transmitted to the MSM chip for being stored in the internal register include the first values and the second values.

6. The apparatus of claim 1, wherein the expansion keys are identified by a combination of I/O ports of the I/O expansion chip.

7. An input method for using an expansion key in a portable terminal, comprising:
    in response to a key input through an M×N expansion key matrix unit, reading first values of M input ports of an Input/Output (I/O) expansion chip, and transmitting the first values to a Mobile Station Modem (MSM) chip to be stored in an internal register, wherein M is a number of input ports and N is a number of output ports;
    changing the M input ports to M output ports, and changing N output ports to N input ports; and
    reading second values of the changed N input ports and transmitting the second values to the MSM chip to be stored in the internal register,
    wherein the I/O expansion chip and the MSM chip communicate with each other by Inter Integrated Circuit (I2C) communication.

8. The method of claim 7, wherein the expansion key matrix unit realizes a key matrix, using an I/O port of the I/O expansion chip.

9. The method of claim 7, wherein the change of the M input ports to the M output ports and the N output ports to the N input ports is realized by changing an internal register value of the I/O expansion chip to determine input and output direction, according to the instruction from the MSM chip.

10. The method of claim 7, wherein values being transmitted to the MSM chip for being stored in the internal register include the first values and the second values.

11. The method of claim 7, wherein the expansion keys are identified by a combination of I/O ports of the I/O expansion chip.

* * * * *